United States Patent [19]
Asai et al.

[11] Patent Number: 5,731,067
[45] Date of Patent: *Mar. 24, 1998

[54] MULTI-LAYERED SUBSTRATE

[75] Inventors: Yasutomi Asai, Okazaki; Takashi Nagasaka, Anjo, both of Japan

[73] Assignee: Denso Corporation, Kariya, Japan

[*] Notice: The term of this patent shall not extend beyond the expiration date of Pat. No. 5,500,278.

[21] Appl. No.: 663,029

[22] Filed: Jun. 7, 1996

[30] Foreign Application Priority Data

Jun. 7, 1995 [JP] Japan ................... 7-140870

[51] Int. Cl.$^6$ ................... B32B 3/00; H05K 7/20; H05K 1/00
[52] U.S. Cl. ................... 428/210; 428/901; 361/688; 174/252
[58] Field of Search ................... 428/901, 209, 428/210; 361/688; 174/252

[56] References Cited

U.S. PATENT DOCUMENTS

| | | | |
|---|---|---|---|
| 4,663,215 | 5/1987 | Dubuisson et al. | 428/209 |
| 4,732,798 | 3/1988 | Ishida et al. | 428/137 |
| 4,795,670 | 1/1989 | Nishigaki et al. | 428/209 |
| 5,063,121 | 11/1991 | Sato et al. | 428/698 |
| 5,093,186 | 3/1992 | Kimura et al. | 428/209 |
| 5,156,903 | 10/1992 | Okumura et al. | 428/209 |
| 5,232,765 | 8/1993 | Yano et al. | 428/195 |
| 5,395,679 | 3/1995 | Myers et al. | 428/209 |
| 5,500,278 | 3/1996 | Nagasaka | 428/210 |
| 5,506,755 | 4/1996 | Miyagi et al. | 361/720 |
| 5,527,627 | 6/1996 | Lautzenhisen et al. | 428/209 |

FOREIGN PATENT DOCUMENTS

| | | |
|---|---|---|
| 4443424 | 6/1995 | Germany. |
| 57-014471 | 1/1982 | Japan. |
| 1-298796 | 12/1989 | Japan. |
| 3-286590 | 12/1991 | Japan. |
| 4-042989 | 2/1992 | Japan. |
| 5-013610 | 1/1993 | Japan. |
| 5-029502 | 2/1993 | Japan. |
| 6-013491 | 1/1994 | Japan. |
| 7-162157 | 8/1995 | Japan. |

OTHER PUBLICATIONS

Nakakawahara: "Layered Ceramic Substrate", Journal of Nippondenso Technical Disclosure, No. 52, Mar. 1987, p. 267 (with English translation).

*Primary Examiner*—Patrick Ryan
*Assistant Examiner*—Cathy F. Lam
*Attorney, Agent, or Firm*—Cushman Darby & Cushman IP Group of Pillsbury Madison & Sutro LLP

[57] ABSTRACT

A multi-layered substrate capable of lowering transient and steady heat resistances. A metal serving as a heat conductor having good heat conducting property is fitted in the uppermost insulating layer, and a power element is disposed on the fitted metal. The heat generated by the power element is conducted to the metal in the uppermost insulating layer and is radiated. The metal can be composed of a mixture of molybdenum particles or tungsten particle having a high melting point and aluminum particles.

26 Claims, 11 Drawing Sheets

MULTI-LAYERED SUBSTRATE

CROSS REFERENCE TO RELATED APPLICATION

This application is based upon and claims the benefit of priority of the prior Japanese Patent application No. 7-140870 filed on Jun. 7, 1995, the contents of which are incorporated herein by reference.

BACKGROUND OF THE INVENTION

1. Field of the Invention

The present invention relates to a multi-layered substrate.

2. Description of the Related Arts

In a conventional multi-layered substrate as shown, for example, in FIG. 12, a thick conductor film 32 composed of copper or silver is printed and baked on a multi-layered ceramic substrate 31, a heat sink 34 composed of molybdenum or copper is arranged thereon via solder 33, and a power element 36 is mounted thereon via solder 35. In FIG. 12, reference numeral 37 denotes a wire and 38 denotes a chip terminal.

According to the above-mentioned conventional multi-layered substrate, however, all the heat that is generated by the power element cannot be fully radiated and this may cause the power element itself and the related portions to be damaged by the heat.

In order to solve the above-mentioned problem, Japanese Unexamined Patent Publication (Kokai) No. 3-286590 discloses an art according to which a large through hole is formed in the multi-layered substrate just under a semiconductor element and a metal paste is filled therein to use it as a heat sink.

SUMMARY OF THE INVENTION

According to the above-mentioned publication, however, the heat sink is formed only in a direction which is perpendicular to the semiconductor element, and the heat is radiated only in the direction perpendicular to the semiconductor element which is not satisfactory. It can be presumed that the heat emitted from the semiconductor element downwardly spreads at an angle of about 45 degrees with respect to the substrate just under the semiconductor element. Therefore, even when the heat sink is formed only under the semiconductor element as taught in the above-mentioned publication, the heat that spreads in the direction of an angle of 45 degrees cannot be radiated to a sufficient degree.

The object of the present invention, therefore, is to provide a multi-layered substrate having a heat sink structure which is capable of favorably radiating the heat generated by a semiconductor element and, particularly, by a power element that generates heat in large amounts.

In view of the fact that the heat generated by the power element spreads not perpendicularly to the multi-layered substrate but in the direction of an angle of nearly 45 degrees, the present inventors have attempted to form the heat sink that extends in a lateral direction in parallel with the surface of the multi-layered substrate, so that the heat generated by the power element spreads in the lateral direction.

With the heat sink being formed extending in the lateral direction of the multi-layered substrate, the heat of the power element can be efficiently conducted and radiated.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

In order to accomplish the above-mentioned objects, the multi-layered substrate according to the present invention basically employs a technical constitution that is described below.

That is, a multi-layered substrate made up of a plurality of insulating layers and on which a power element is mounted, wherein said multi-layered substrate contains therein a heat sink which quickly absorbs the heat generated by the power element and diffuses and radiates the heat to the periphery thereof, the heat sink being formed in parallel with the surface of the multi-layered substrate and extending in the lateral direction. Concretely speaking, the heat sink should have a shape that is longer in the lateral direction than in the direction of thickness of the multi-layered substrate. When the heat sinks are formed in a plural number in many stages in each of the layers of the multi-layered substrate, the heat sinks should have lengths that increase in the lateral direction the further away they are from the surface of the multi-layered substrate on which the power element is mounted.

Embodiments of the multi-layered substrate according to the present invention will now be described in detail with reference to the drawings.

Figure 1:
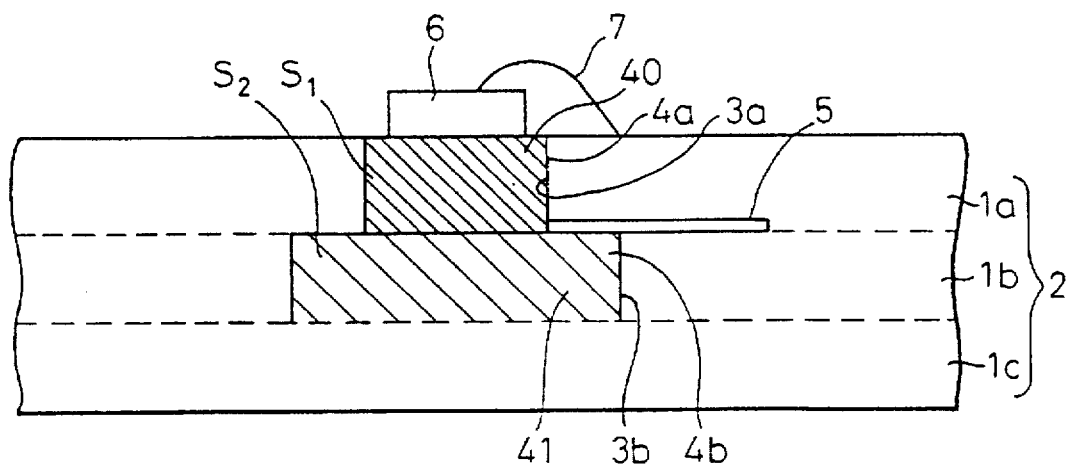
FIG. 1 is a sectional view illustrating the constitution of a multi-layered substrate according to an embodiment of the present invention.

FIG. 1 is a diagram illustrating the whole constitution of a multi-layered substrate 2 according to an embodiment of the present invention. A multi-layered substrate 2 is formed by stacking three insulating layers 1a, 1b and 1c that are composed of alumina. In a predetermined region S1 of the uppermost insulating layer 1a of the multi-layered substrate 2 is formed a through portion 3a for holding a metal that will be fitted therein. The through portion 3a is fitted with a metal 4a which is a heat conductor having good heat conducting property.

A through portion 3b for holding a metal is formed in a predetermined region S2 in the intermediate insulating layer 1b or, preferably, in a region S2 that overlaps the above-mentioned predetermined region S1. The through portion 3b is fitted with a metal 4b which will be of the same kind as the above-mentioned metal 4a.

The through portions 3a and 3b are arranged in a direction in parallel with the main surface of the multi-layered substrate. Here, the through portion 3b is longer than the through portion 3a in the lateral direction, and has an area which is larger than the area of the through portion 3a. The metals 4a and 4b fitted therein are electrically connected to an inner wiring 5 in the insulating layer 1b. Furthermore, the metals 4a and 4b are composed of a mixture of molybdenum particles having a high melting point and alumina particles. Here, molybdenum has a heat conductivity of 0.328 cal·cm$^{-1}$deg$^{-1}$s$^{-1}$ (20° C.) and a melting point of 2,622°±10° C. The metal 4 may further be comprised of a mixture of tungsten particles having a high melting point and alumina particles, or a mixture of molybdenum particles, tungsten particles and alumina particles. Here, tungsten has a heat conductivity of 0.382 cal·cm$^{-1}$deg$^{-1}$s$^{-1}$ (20° C.) and a melting point of 3.382° C.

A power element 6 is die-mounted on the metal 4a using a solder (or a silver paste). The power element 6 is electrically connected to an electrically conducting portion on the uppermost insulating layer 1a of the multi-layer substrate 2 through a wire 7.

A method of fabricating the multi-layer substrate 2 will now be described with reference to FIGS. 2 to 6.

Figure 2:
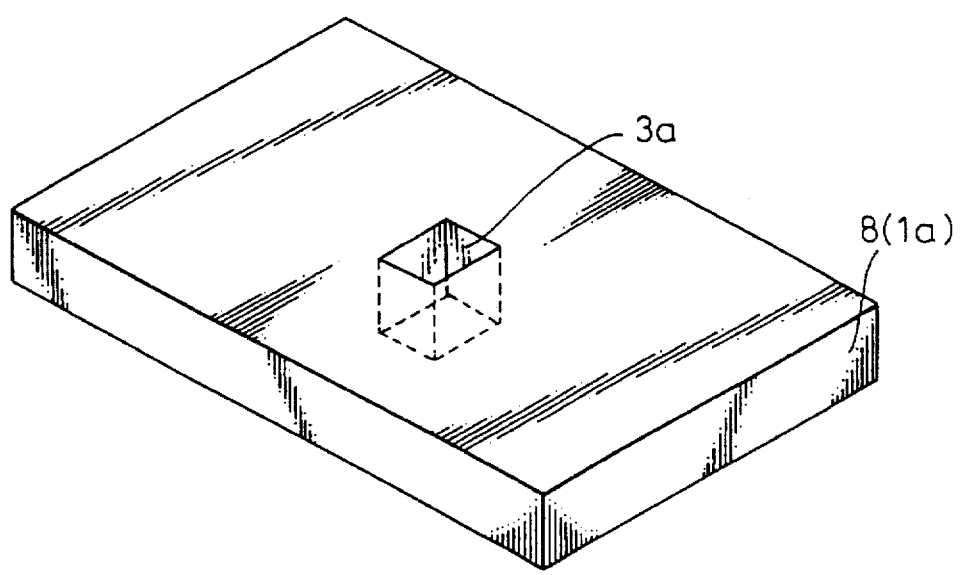
FIGS. 2 to 6 are perspective views illustrating the steps for fabricating the multi-layered substrate of the embodiment.

With reference to FIG. 2, a flat plate-like alumina green sheet 8 (1a of FIG. 1) is prepared. The alumina green sheet 8 has a thickness of 0.254 mm. A square through portion 3a is formed by punching in a predetermined region of the alumina green sheet 8. The through portion 3a may be formed during the step of forming a through hole for a viahole.

Figure 3:
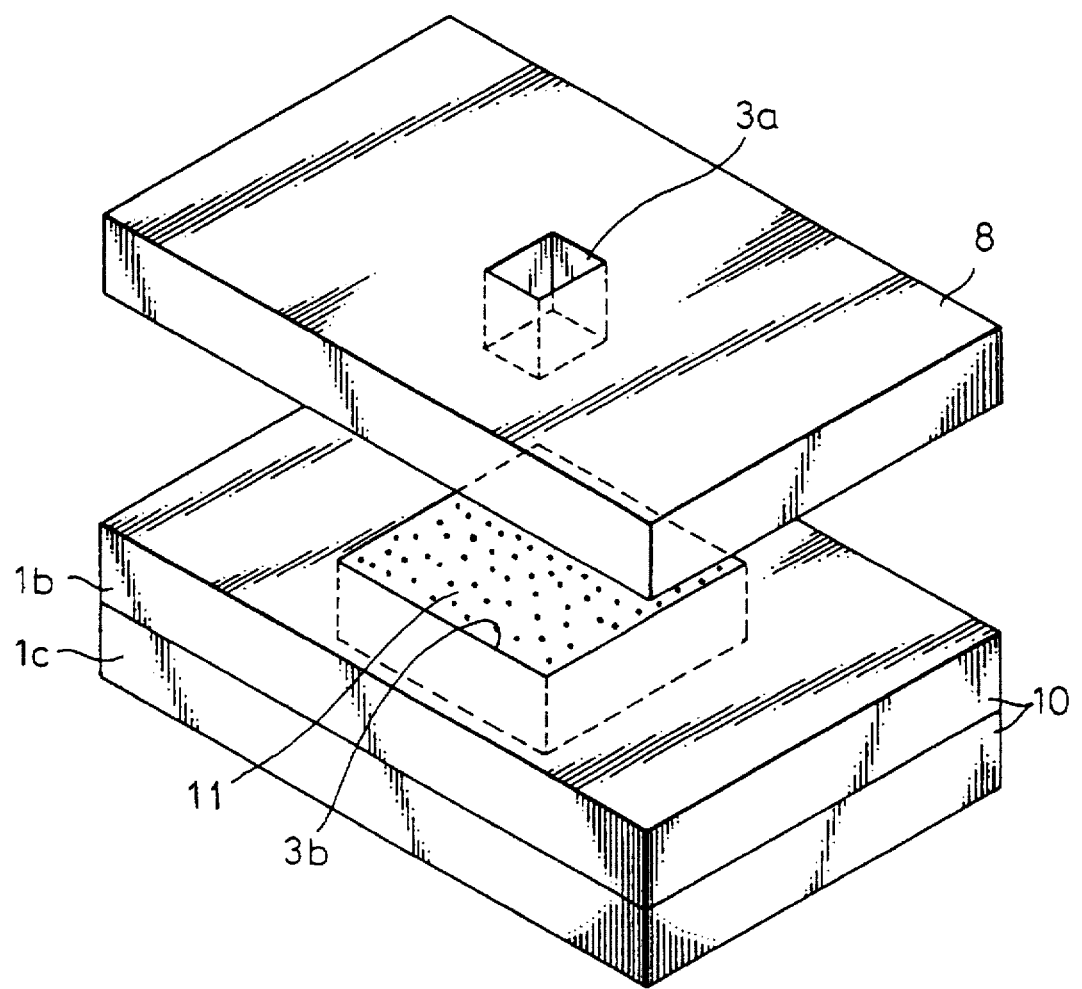
Figure 4:
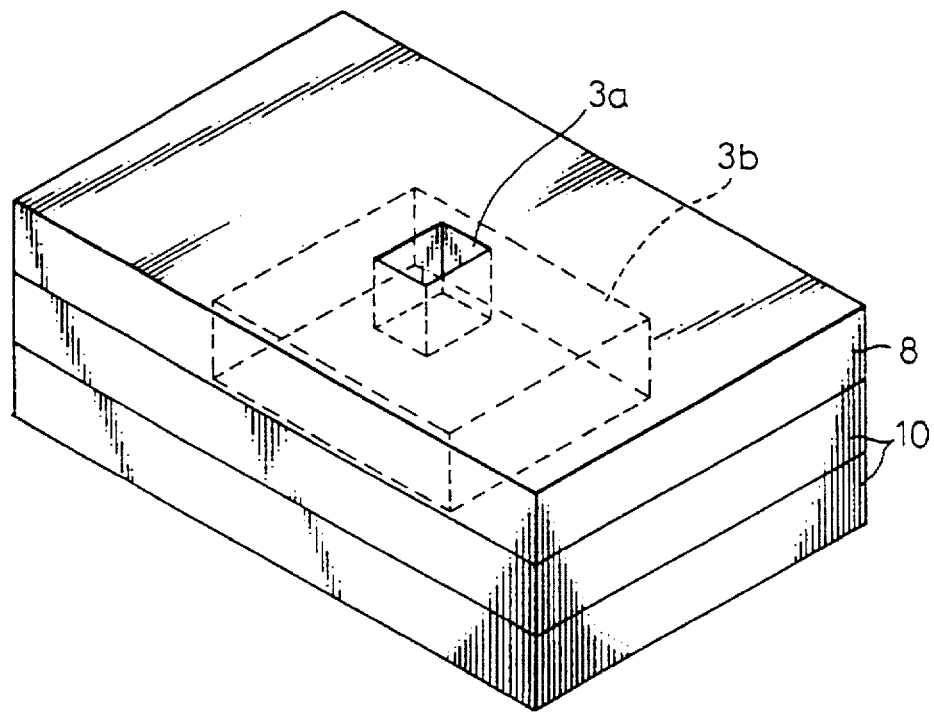

Then, as shown in FIG. 3, an alumina green sheet for layer 1b, in which the through portion 3b is formed, is placed on another alumina green sheet for layer 1c that has no through portion, to form a stacked alumina green sheet 10, and the metal is filled into the through portion 3b. That is, by using an emulsion mask or a metal mask, the through portion 3b is filled by printing with a paste 11 of a mixture of molybdenum particles and alumina particles. Then the alumina green sheet 8 is placed on the alumina green sheet 10. The resulting alumina green sheet is shown in FIG. 4.

Figure 5:
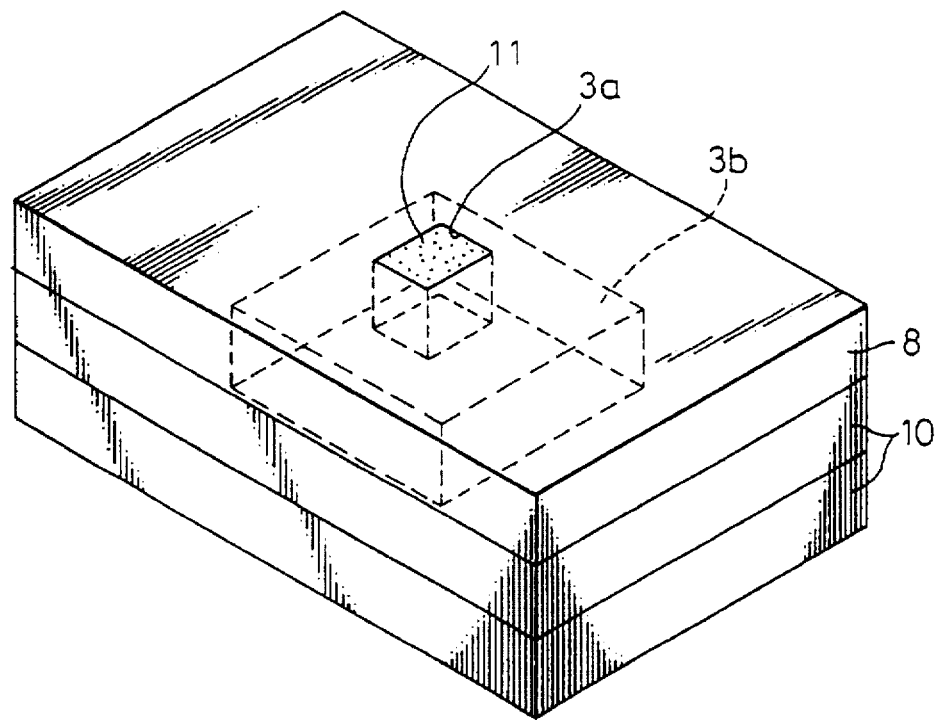

Then, by using an emulsion mask or a metal mask as shown in FIG. 5, the through portion 3a is filled by printing with a paste 11 of a mixture of molybdenum particles and alumina particles.

Thereafter, the laminated alumina green sheets 8 and 10 are baked at a temperature of a thousand and several hundred degrees centigrade with the application of pressure, thereby to obtain a multi-layered ceramic substrate. In order to improve contacting ability, furthermore, electroplating is applied onto the conductor portion (metal 4 formed by baking the paste 11, metallized portion) on the surface of the baked multi-layered substrate. Then, a thick-film conductor, a thick-film resistor, glass and the like, are printed and baked repetitively on the front surface or on the back surface of the multi-layered substrate.

Figure 6:
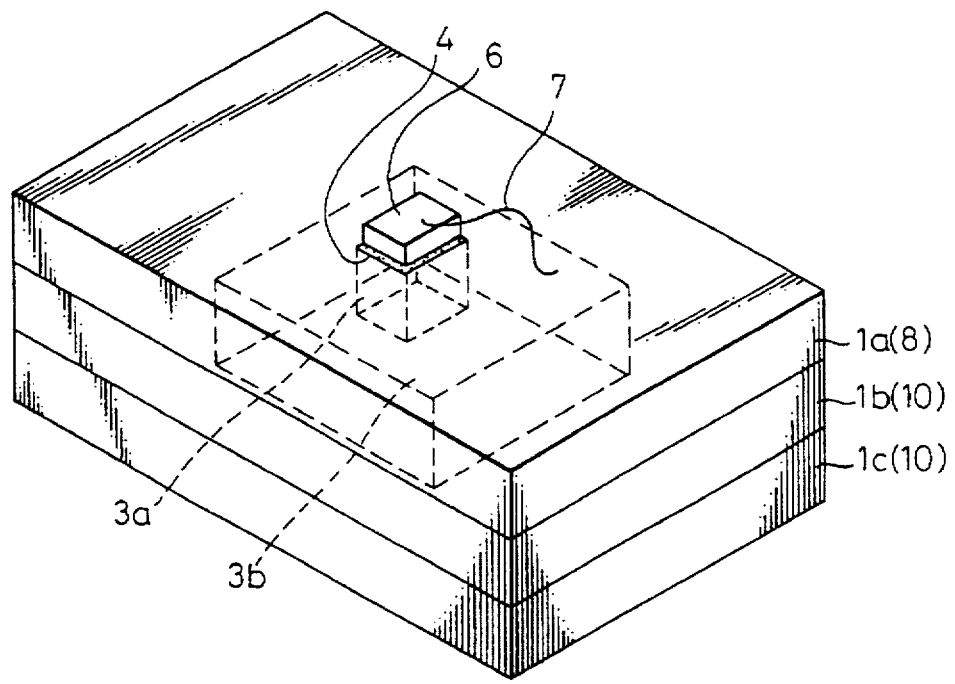

Next, as shown in FIG. 6, the power element 6 is mounted, using a solder (or a silver paste), on the metal 4 that is formed by baking the paste 11 inserted in the through portions 3a and 3b, and a wire 7 is bonded thereto. Thus, the multi-layered substrate 2 is formed as shown in FIG. 1.

In the constitution of FIG. 1, the heat generated by the power element 6 is absorbed by the metals 4a and 4b. Besides, since the molybdenum component of the metals 4a and 4b has a very small resistance, the amount of heat generated by the whole substrate is low when the metals 4a and 4b are used as wiring.

That is, according to the present invention as shown in FIG. 1, a heat sink of a multi-stage structure is constituted by a first heat sink 40 formed in the first through portion 3a and a second heat sink 41 formed in the second through portion 3b, the second heat sink 41 which is formed under the first heat sink 40 being wider than the first heat sink 40. Therefore, the heat generated by the power element 6 and spreading downwardly from the multi-layered substrate 2 nearly at an angle of 45 degrees is readily absorbed and is radiated downwardly in the multi-layered substrate. Accordingly, the heat generated by the power element can be efficiently radiated.

Figure 12:
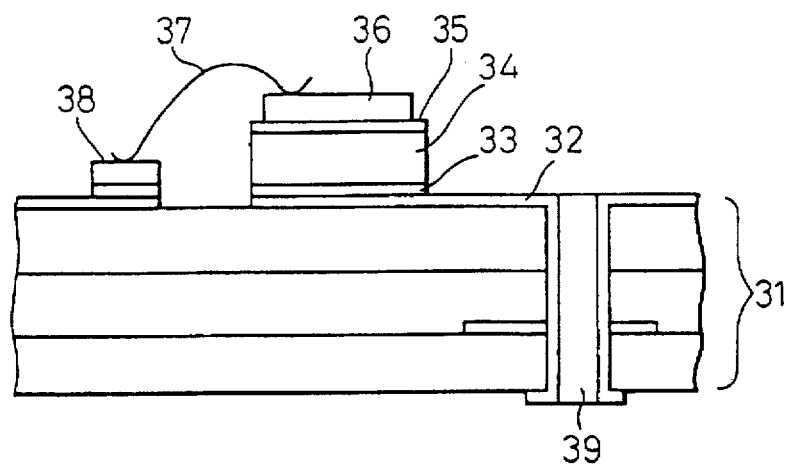
FIG. 12 is a sectional view illustrating a conventional multi-layered substrate.

According to the present invention, furthermore, the heat sinks 40 and 41 composed of metals 4a and 4b can have increased thicknesses, and the electric resistance can be decreased down to one tenth or less, that of a surface conductor layer (thick conductor film 32 in FIG. 12) which may be used. The heat resistance becomes about 80% to 90% of the resistance of molybdenum. By increasing any one of thickness, area and volume of the metal 4, furthermore, the heat resistance can be decreased much more than a reduction of the heat resistance obtained by a heat sink 34 as shown in FIG. 12.

The metals 4a and 4b, which are composed of a mixture of molybdenum particles and alumina particles, exhibit a coefficient of thermal expansion that is close to the coefficient of thermal expansion of the alumina substrate. This makes it possible to suppress the thermal stress between the alumina substrate and the metals 4a and 4b.

According to this embodiment, as described above, the metal (heat conductor) 4a having good heat conducting property is fitted in the surface layer (insulating layer 1a), the power element 6 is disposed on the metal 4a, and the metal 4b that is in contact with the metal 4a is fitted in the lower insulating layer 1b. Therefore, the heat generated by the power element 6 is conducted and is radiated through the metal 4a fitted in the surface layer (insulating layer 1a) and the metal 4b fitted in the lower layer 1b. In this case, if it is so considered that a conventional heat sink has been arranged in the substrate, the transient heat resistance can be decreased by increasing the volumes of the metals 4a and 4b. Since the transient heat resistance can be thus lowered, the steady heat resistance can be lowered, too, by decreasing the thickness of the heat sink. In other words, the invention does not use a heat sink that upwardly protrudes beyond the surface layer that is used in the prior art, and permits the heat sink to be formed in a small size, contributing to decreasing the manufacturing cost and decreasing the volume of mounting. Besides, there is no need of using such an expensive substrate material as AlN for radiating the heat, and a substrate having an excellent heat conducting property can be cheaply obtained.

Since the metals 4a and 4b contain molybdenum particles having a high melting point (2,622°±10° C., which is higher than a temperature of baking the multi-layered substrate 2), molybdenum constituting the metal does not melt even when the green sheet is baked at a temperature of a thousand and several hundred degrees centigrade after the paste of the metal is introduced into the green sheet.

Furthermore, the wider heat sink 41 is positioned so as to be buried in the multi-layered substrate 2, mounting on the surface of the multi-layered substrate 2 can be performed with high integration.

Figure 7:
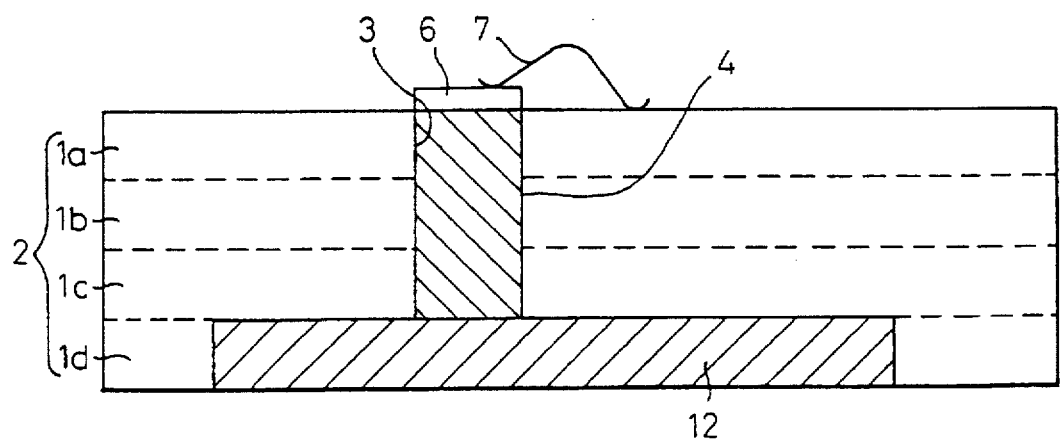
FIG. 7 is a sectional view illustrating the constitution of the multi-layered substrate according to another embodiment of the present invention.

The present invention is not limited to the above-mentioned embodiment only. As shown in FIG. 7, for instance, through portions 3 of the same size may be provided in a plurality of layers (three layers in FIG. 7) and may be fitted with the metal 4. In this case, the heat generated by the power element 6 is quickly absorbed by a metal plate 12 that extends in the lateral direction and is adhered with an adhesive to the back surface of the multi-layered substrate 2; i.e., the heat is radiated from the metal plate 12. In this case, furthermore, ground level of potential can be commonly used.

Figure 8:
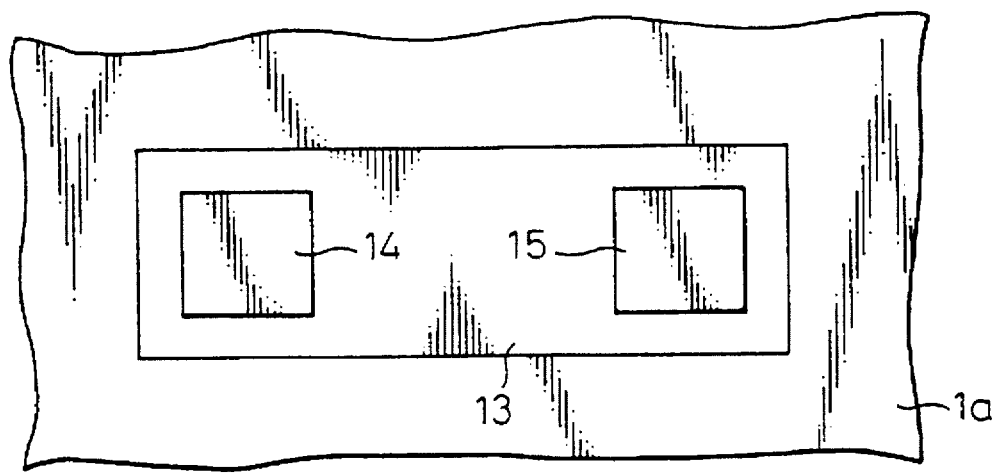
FIG. 8 is a plan view of the multi-layered substrate according to a further embodiment.
Figure 9:
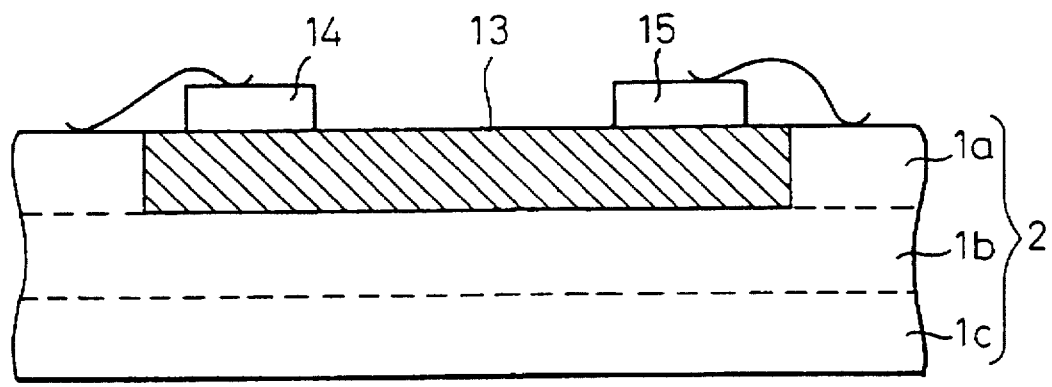
FIG. 9 is a sectional view of the multi-layered substrate of FIG. 8.

Referring to FIGS. 8 and 9, furthermore, a metal 13 is arranged in an extending manner in the uppermost insulating layer 1a of the multi-layered substrate 2, and power elements 14 and 15 are disposed on the metal 13 being separated away from each other. The power elements 14 and 15 may be electrically connected together through the metal 13.

Figure 10:
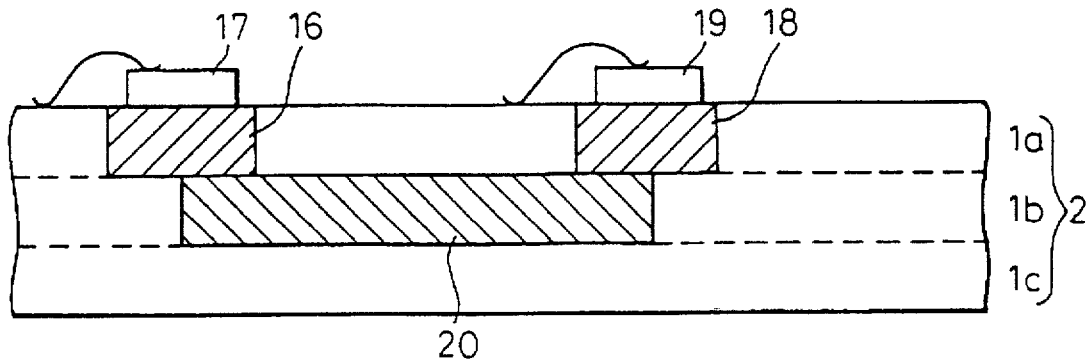
FIG. 10 is a sectional view of the multi-layered substrate according to a still further embodiment.

Then, referring to FIG. 10, a metal 16 is disposed in the uppermost insulating layer 1a of the multi-layered substrate 2 and a power element 17 is disposed on the metal 16. Another metal 18 is disposed in the uppermost insulating layer 1a of the multi-layered substrate 2 being separated away from the metal 16, and a power element 19 is disposed on the metal 18. Then, a wiring material 20 is disposed in the insulating layer 1b of the multi-layered substrate 2 to accomplish the wiring in the direction of the surface thereof. The metal 16 fitted in the insulating layer 1a and the metal 18 fitted in the insulating layer 1a may then be electrically connected together through the wiring material 20 in the insulating layer 1b.

When the embodiment shown in FIG. 9 is compared with the embodiment shown in FIG. 10, the heat sink 20 in FIG. 10 is formed inside the multi-layered substrate extending in the lateral direction. This enables the devices to be highly densely mounted on the surface compared with the substrate of the embodiment of FIG. 9.

Figure 11:
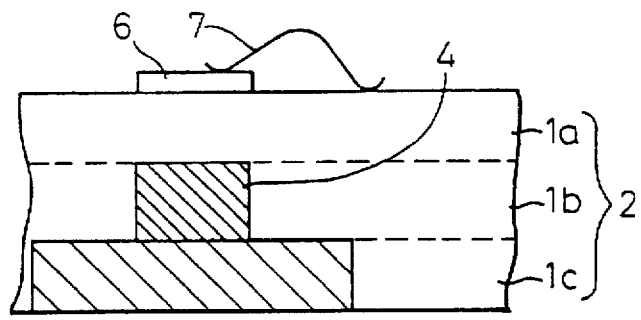
FIG. 11 is a sectional view of the multi-layered substrate according to a yet further embodiment.

As shown in FIG. 11, furthermore, the metals may be disposed in the second and subsequent insulating layers 1b and 1c instead of disposing the metal in the uppermost insulating layer 1a of the multi-layered substrate 2. In this case, though the heat sink 4 under the power element 6 is not in direct contact with the power element 6, the heat generated from the power element 6 can be absorbed and radiated to a degree to thereby obtain an effect equivalent to that of when the heat sink is in direct contact with the power element 6.

Described below are further embodiments of the multi-layered substrate according to the present invention.

Figure 13:
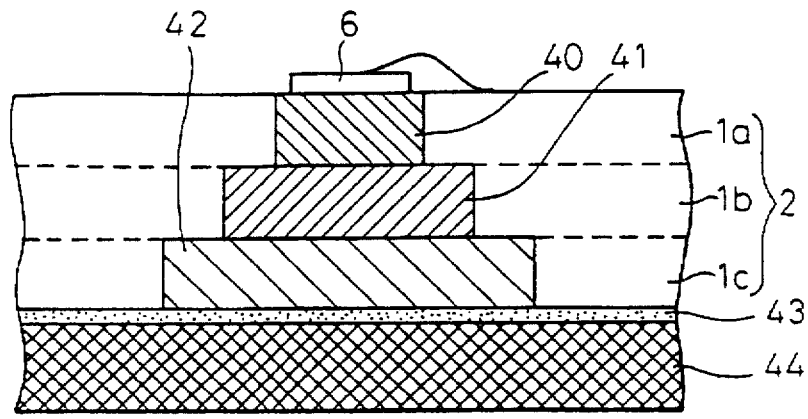
FIGS. 13 to 15 are sectional views illustrating the multi-layered substrates according to further modified embodiments of the present invention.

FIG. 13 illustrates the multi-layered substrate of FIG. 1 according to a modified embodiment of the present invention. In this case, the heat sink that extends in the lateral direction to absorb the heat is further extended as to have an increased width as represented by an alumina layer 1c shown in FIG. 13, i.e., as represented by a third heat sink 42.

Here, the heat sink 42 may not be entirely buried in the heat sink region but may be in a perforated state. According to this structure in which plural stages of heat sink layers are stacked in a pyramidal shape, the heat that spreads in the direction of 45 degrees can be absorbed and radiated well. Moreover, a heat-radiating plate 44 made of aluminum may be joined with an adhesive 43 to the multi-layered substrate 2 to radiate the heat. In this case, the heat resistance can be greatly decreased by using the adhesive 43 having high heat conducting property.

Figure 14:
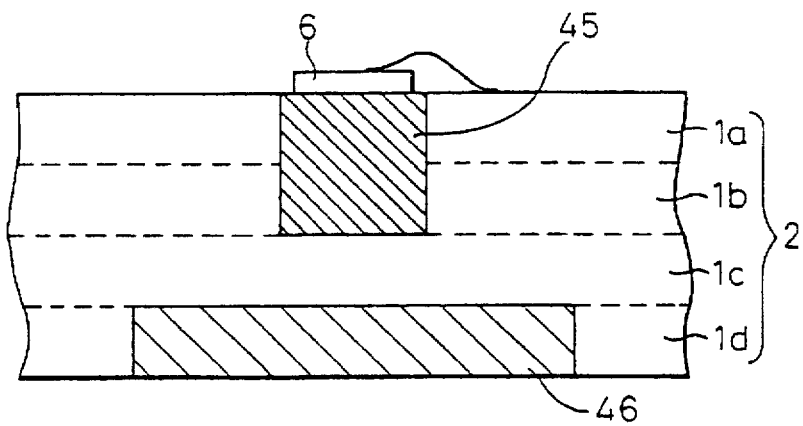

As shown in FIG. 14, furthermore, a small heat sink 45 may be formed in the first insulating layer 1a or in the first and second insulating layers 1a and 1b under the power element 6, and a third wide heat sink 46 may be formed in the lower layer. In this case, the heat sink 46 having an area wider than that of the heat sink 45 may be provided in the third insulating layer 1c or may be provided in the fourth insulating layer 1d via the third insulating layer.

According to the structure in which the heat sink 46 which is a conductor is provided in the lowermost layer 1d and the heat is radiated from the back surface of the substrate, the heat sink under the power element 6 is brought into direct contact with the lowermost layer 1d when a current is not flowing through the heat sink, thereby to obtain a good heat radiating performance.

Figure 15:
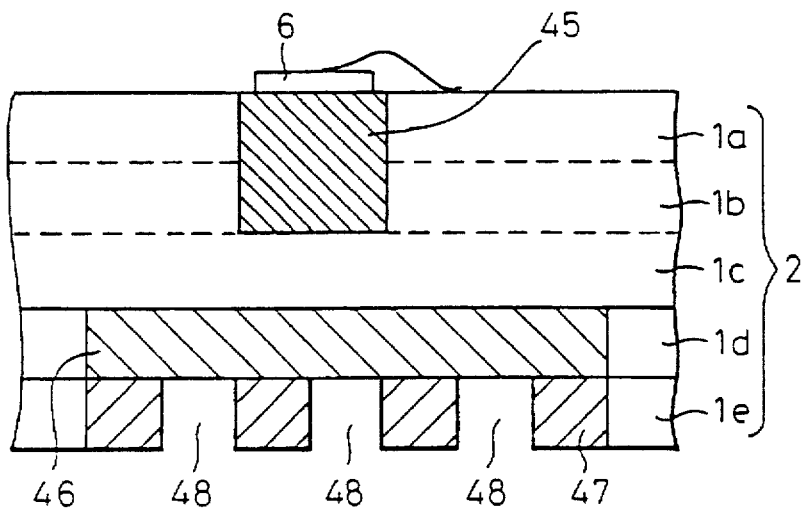

FIG. 15 illustrates a still further embodiment modified from the embodiment of FIG. 14. That is, another insulating layer 1e is provided under the heat sink 46 of FIG. 14, a wide fourth heat sink 47 having an area larger than the upper heat sink 45 is provided in the insulating layer 1e, and a number of holes 48 are formed in the fourth heat sink 47. This makes it possible to increase the heat-radiating area and to increase the heat-radiating performance.

This structure can be obtained even by subjecting the conductor metal to the treatment of forming cavities at the time of preparing the green sheet.

Figure 16A:
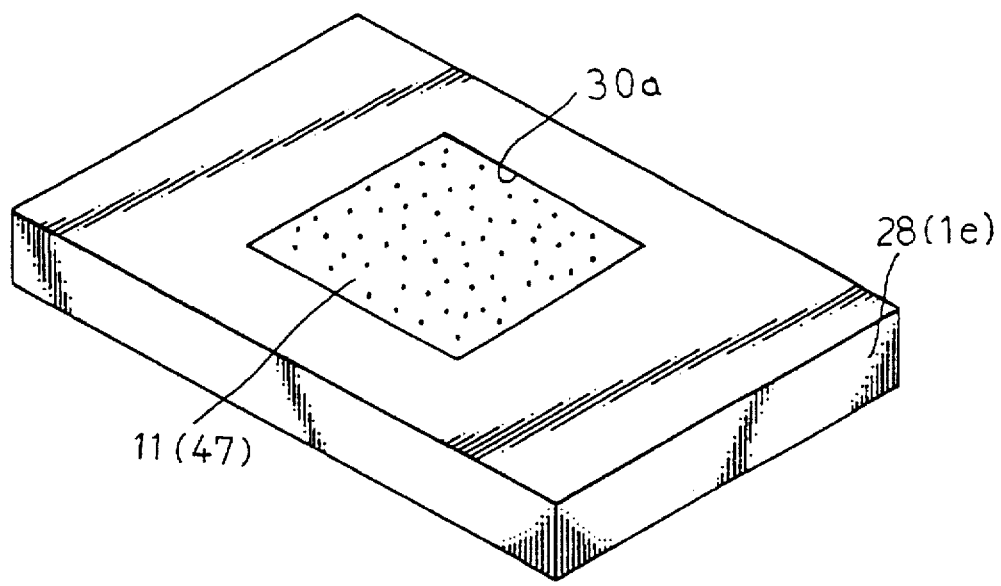
FIGS. 16A and 16B are perspective views illustrating a partial steps for fabricating the multi-layered substrate of the embodiment of FIG. 15.
Figure 16B:
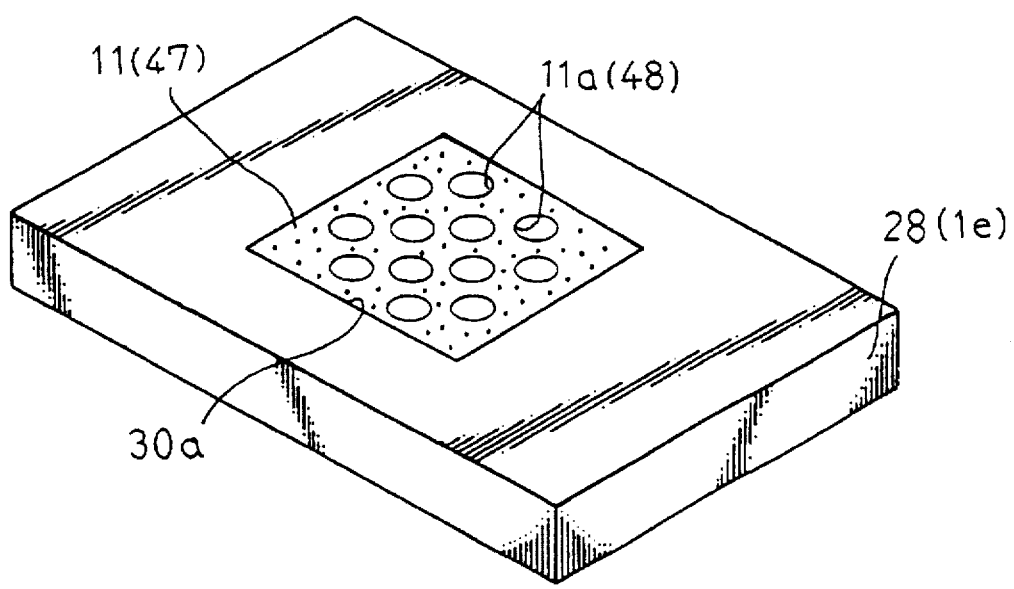

Specifically, as shown in FIGS. 16A and 16B, the alumina layer 1e can be formed by punching a green sheet 28 to form a through portion 30a for disposing the metal, then disposing the metal paste 11 therein followed by drying and then forming a plurality of holes 11a by punching. Then, the laminating and baking processes for forming the multi-layered substrate 2 are carried out as mentioned above, using the green sheet 28 as the lowermost layer 1e.

In the above embodiments of FIGS. 1, 13 and 14, for example, furthermore, the heat sinks may be formed inside the multi-layered substrate, enabling the surfaces of the multi-layered substrate to be used more freely, i.e., enabling the devices to be densely mounted on the surfaces.

Figure 17A:
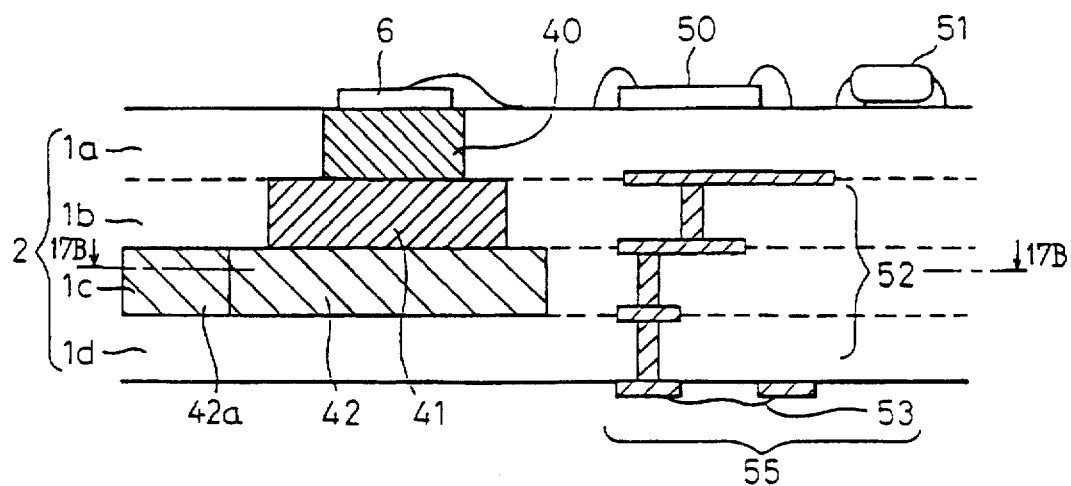
FIG. 17A is a sectional view of the multi-layered substrate according to an applied embodiment of the present invention.
Figure 17B:
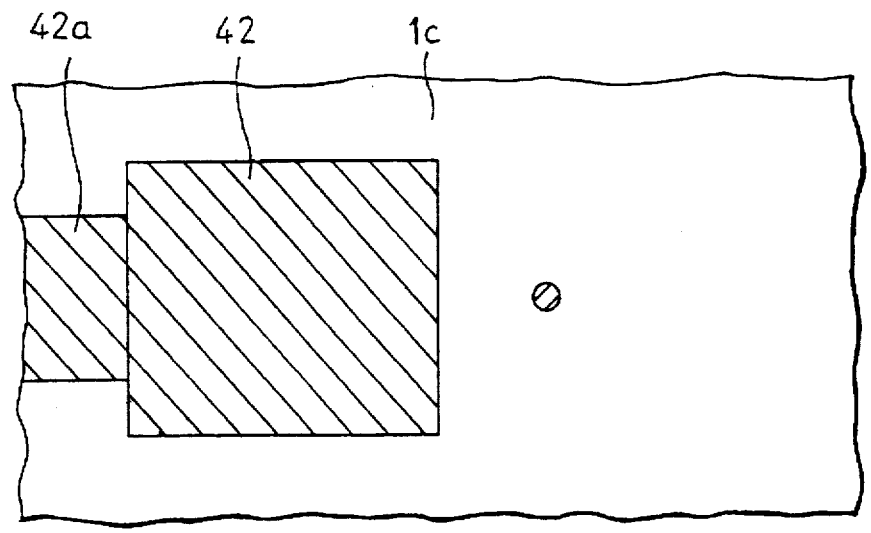
FIG. 17B is a sectional view taken along line 17B—17B of FIG. 17A.

Referring to FIGS. 17A and 17B, the heat sinks 40 to 42 are arranged such that plural stages of heat sink layers are stacked in a pyramidal shape, and thus the heat that spreads in the direction of 45 degrees can be absorbed and radiated well. Furthermore, a portion 42a extends from the heat sink 42 in a direction away from an IC circuit 50 and a control circuit 55 such as a microcomputer made up of internal wiring 52, capacitor 51 and resistor 53, which control the power element 6 but which are subjected to be affected by the heat. In this case, the heat generated by the power element is prevented from spreading in the lateral direction but is radiated; i.e., directivity is imparted to the heat conduction to suppress the rise of temperature of the substrate at the element portions such as control circuits that are subjected to be affected by the heat. That is, the heat sinks 40, 41 and 42 formed in the insulating layers 1a, 1b and 1c of the multi-layered substrate 2 are arranged so as to be led by the extending portion 42a toward the left in the drawing.

In other words, a rise in temperature of the substrate around the control circuits can be suppressed if the heat sinks are connected to the portion 42a extending in a direction to separate away from ICs such as microcomputers, wirings, capacitors and resistors that control the power element but that are subjected to be affected by heat.

Furthermore, the extending portion 42a can be used as an internal wiring for the power element 6. In this case, since the thickness of the internal wiring is thick, electrical resistance thereof can be made low, and the amount of heat generated by the whole substrate is low. Also, as compared with a case where the extending portion 42a is disposed in the uppermost layer 1a, degrees of freedom in the wiring integration design can be improved by disposing the extending portion 42a in a lower layer, and simultaneously the high density mounting on the surface of the substrate 2 becomes possible.

Figure 18:
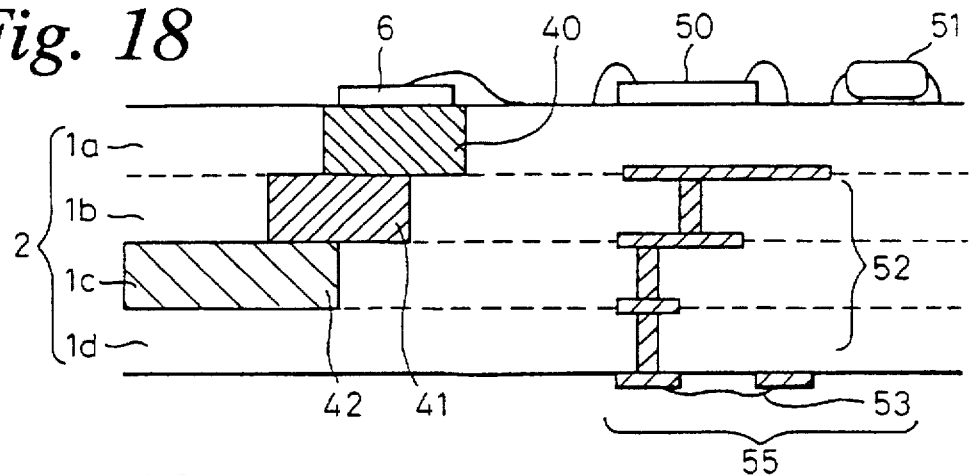
FIGS. 18 to 23 are sectional views illustrating the multi-layered substrates according to further applied embodiments of the present invention.

FIG. 18 illustrates another modification of FIG. 17A. In FIG. 18, the heat sinks 40 to 42 are arranged like stairs in a direction away from the control circuit 55 including the IC circuit 50. In this case, the heat generated by the power element is prevented from spreading in the lateral direction but is radiated; i.e., directivity is imparted to the heat conduction to suppress the rise of temperature of the substrate at the control circuit part 55. That is, the heat sinks 40, 41 and 42 formed in the insulating layers 1a, 1b and 1c of the multi-layered substrate 2 are deviated toward the left in the drawing as they go downwards. By means of this arrangement, a rise in temperature of the substrate around the control circuits can be suppressed because the heat sinks are formed in a direction to separate away from the control circuits.

The heat diffusing in the lateral direction can be absorbed by an auxiliary heat sink that is formed in the lateral direction of the power element in order to suppress the heat from spreading in the lateral direction toward the control circuits. That is, the heat conducted to the substrate through the heat sink having better heat conducting property than the alumina substrate is permitted by the auxiliary heat sink to escape into a portion of the substrate lower or other than the control circuits. Thus, directivity is imparted to the conduction of heat to suppress the effect upon the control circuits.

Figure 19:
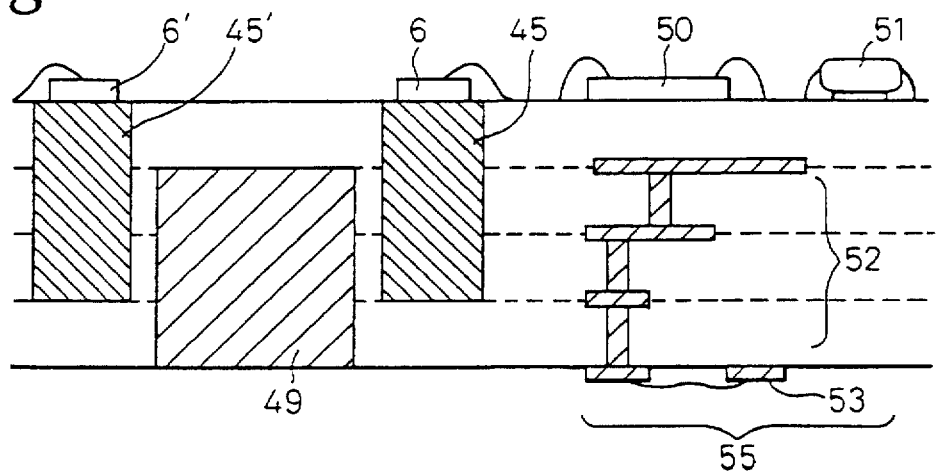

FIG. 19 illustrates an embodiment modified from the embodiment of FIG. 17A, and wherein vertically extending heat sinks 45 and 45' like that of FIG. 14 are formed just under the power elements 6 and 6', and a second heat sink 49 is disposed between them being deviated in position in the vertical direction from the heat sinks 45 and 45', the second heat sink 49 upwardly extending from the lowermost surface of the multi-layered substrate. Even in this constitution, the conductor-fitting portions 45, 49 are formed at places remote from the control circuit 55 but close to the power elements 6 and 6', and the heat of the power elements 6 and 6' is guided into these portions, in order to restrict the direction of heat radiation and to prevent or reduce the conduction of heat to the control circuit 55.

Figure 20:
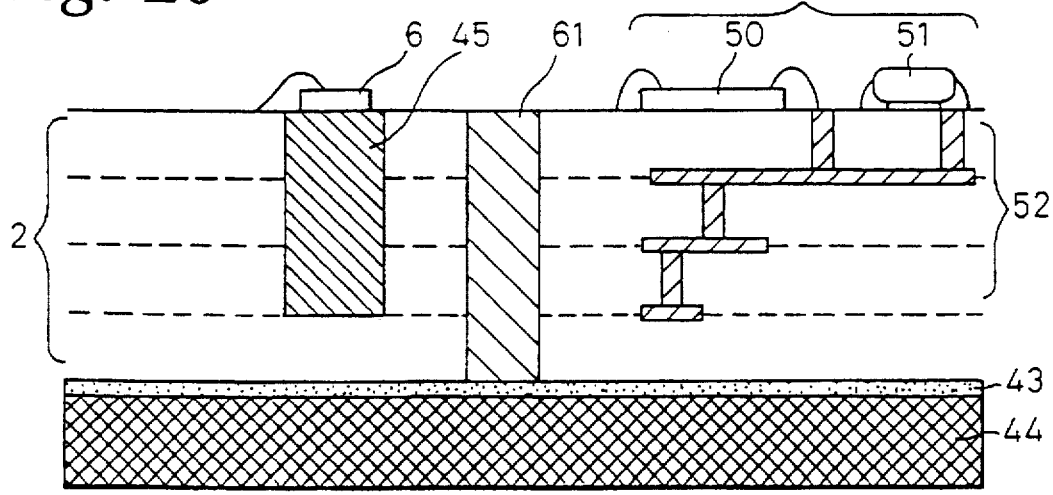

FIG. 20 illustrates a yet further embodiment modified from the embodiment of FIG. 17A, and wherein an auxiliary heat sink 61 is provided in parallel with the heat sink 45 under the power element 6. The auxiliary heat sink 61 consisting of a conductor-fitting portion is provided between the power element 6 and a circuit such as control circuit 55 that is subjected to be affected by the heat, and a heat-radiating plate 44 is joined using an adhesive 43 having highly heat conducting property. Therefore, the heat of the power unit 6 is conducted from the conductor-fitting portion 61 to the heat-radiating plate 44, and is not conducted to the control circuit 55.

Figure 21:
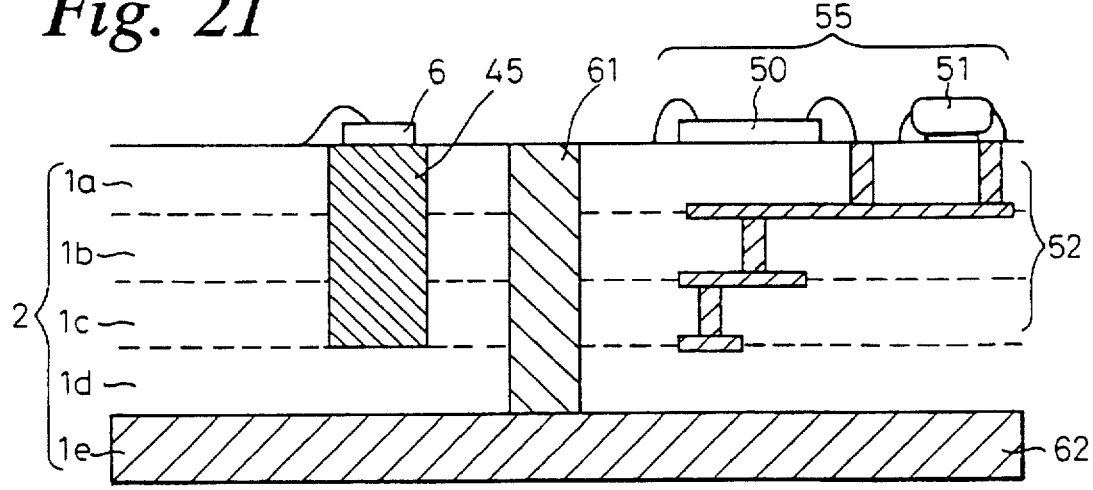
Figure 22:
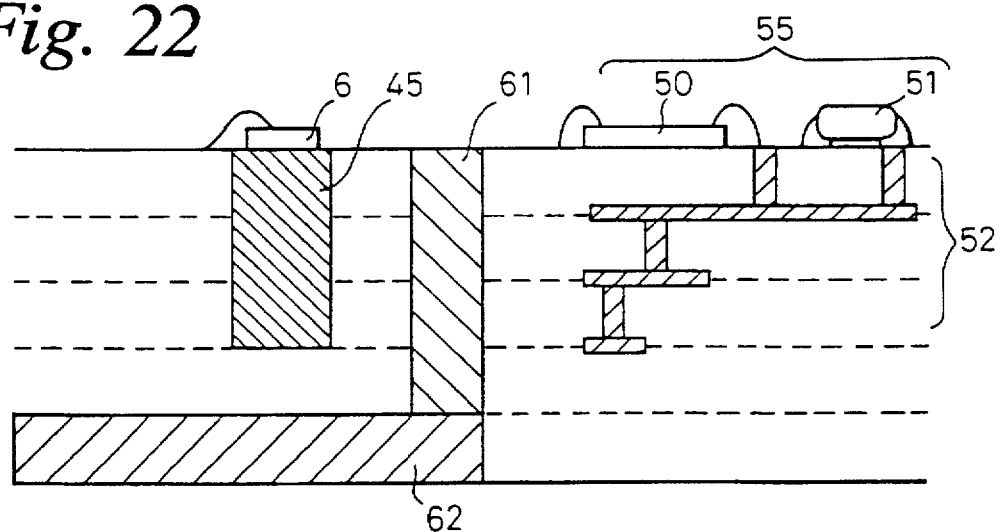

FIGS. 21 and 22 illustrate multi-layered substrates according to other embodiments modified from the embodiment of FIG. 17A, and wherein the lowermost alumina insulating layer 1e of the multi-layered substrate 2 is provided with a heat sink 62 consisting of a buried conductor portion instead of the heat-radiating plate 44 shown in FIG. 20, and the heat sink 62 is connected to the auxiliary heat sink 61. In FIG. 22, the heat sink 62 is arranged under the power element 6 only but is not arranged under the control circuit 55.

In the above-mentioned embodiments, the lowermost layer may be provided with the conductor-fitting portion 62 instead of the heat-radiating plate 44 to excellently stop the heat from being conducted to the control circuit. The structure shown in FIG. 22 is superior to the structure of FIG. 21 with respect to the directivity in the heat conduction. With respect to the heat-radiating performance, however, the structure of FIG. 21 is superior to the structure of FIG. 22.

In the structures of FIGS. 21 and 22, the heat sink 45 provided under the power element 6 does not penetrate through to the lowermost layer of the multi-layered substrate. The present invention, however, is in no way limited to the above-mentioned structures only but encompasses structures in which the heat sink 45 is connected to the heat sink 62 of the lowermost layer of the substrate 2.

Furthermore, in the structures of FIGS. 20 through 22, the auxiliary heat sink 61 appears on the surface of the multi-layered substrate (uppermost insulating layer 1a). The present invention, however, is not limited to the above-mentioned structures only but encompasses structures in which the auxiliary heat sink 61 is so designed that it will not be formed in the uppermost alumina layer of the multi-layered substrate 2. In this case, the mounting density on the surface of the multi-layered substrate 2 can be increased.

In the multi-layered substrate of the present invention as described above, the heat sink is so constituted as to absorb the heat that is generated from the power element and is spread in the lateral direction. Moreover, the heat sink disposed in the layers has a wide area to serve as a heat-radiation plate from which the heat generated by the power element is radiated. Therefore, the multi-layered substrate has excellent heat-radiating performance.

As the most desirable constitution of the multi-layered substrate of the present invention, therefore, the heat sink 13 is widely formed as shown in FIG. 9 in the uppermost alumina layer of the multi-layered substrate 2.

The heat sink 13 need not necessarily be formed in the uppermost layer of the multi-layered substrate 2, but may be formed in the intermediate layer or in the lowermost layer of the multi-layered substrate 2.

In all of the embodiments mentioned above, the conductor layer of the invention can be used as an inner wiring. In this case, low-resistance wiring is realized in the multi-layered substrate.

The multi-layered substrate 2 of the present invention can be applied even to packed structures such as of a pin-grid array (PGA) incorporating an IC that generates large amounts of heat, a chip carrier, a slide brazing, a flat package and the like.

Figure 23:
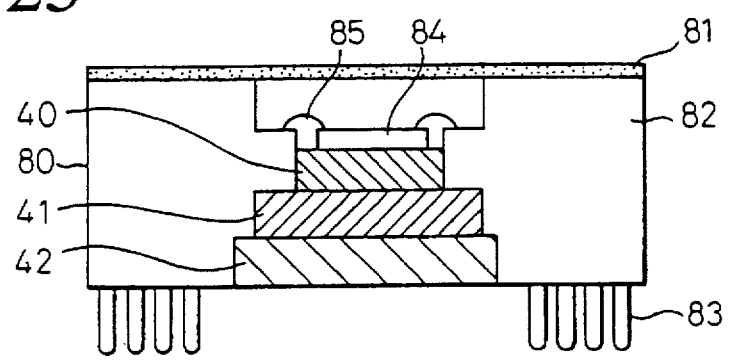

FIG. 23 illustrates an example in which the multi-layered substrate according to the present invention is applied to a pin-grid array (PGA), wherein the pin-grid array (PGA) 80 is constituted by a ceramic plate 81, a ceramic package 82 and pin terminals 83. In the ceramic package 82, are incorporated an IC that generates large amounts of heat and an element 84 that generates large amounts of heat. The ceramic plate 81 is provided as a sealing member for protecting the IC that generates large amounts of heat, the element 84 that generates large amounts of heat and wire-bonding portions 85.

In the ceramic package 82 is further formed a heat-radiating portion consisting of a plurality of heat sinks 40, 41 and 42 that are stacked in plural stages in a pyramidal manner as contemplated by the present invention. The heat generated from the IC that generates large amounts of heat and from the element 84 that generates large amounts of heat is radiated into the open air through the heat sinks 40, 41, and 42 that are conductor-fitting portions enabling the heat resistance to be decreased.

The power element 6 which is regarded by the present invention will be, for example, a power transistor, a power diode, or an element that produces large amounts of heat such as a high-speed microcomputer or a microcomputer in a super-computer or in a work station.

The power element according to the present invention is formed on a silicon substrate, and the heat sink will be composed of molybdenum or tungsten. In this case, silicon has a coefficient of thermal expansion of 3 ppm/°C., molybdenum has a coefficient of thermal expansion of 4 ppm/°C. and tungsten has a coefficient of thermal expansion of 4.5 ppm/°C. Therefore, these materials match well to each other in regard to coefficients of thermal expansion, and there is no need to provide a stress-absorbing layer.

Even when the alumina substrate is used or even when the alumina and the above-mentioned high-melting material are used in the present invention, good matching is obtained relative to the substrate in regard to coefficients of thermal expansion.

That is, the alumina substrate has a coefficient of thermal expansion of 7.5 ppm/°C., and molybdenum and tungsten that are filler materials have coefficients of thermal expansion of about 3.7 ppm/°C. to 5.3 ppm/°C. and about 4.5 ppm/°C. to 5.0 ppm/°C. which are close to each other. Therefore, it does not happen that the filler material escapes during or after baking.

As the substrate material, there can be used a glass ceramic which is a composite material of a glass and a ceramic, or a glass material instead of the alumina substrate. The conductor in this case will be Ag, Ag—Pd, Cu or the like. The preparation method is the same as that of the case of alumina.

According to the present invention as described above in detail, the transient heat resistance and the steady heat resistance can be lowered. Moreover, since the heat sink protruding beyond the uppermost layer can be eliminated or can be decreased in size, it is possible to decrease the mounting volume. Besides, there is no need to use an expensive substrate material such as AlN for radiating the heat, and a substrate having an excellent heat conducting property can be cheaply produced.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A multi-layered substrate made up of a plurality of insulating layers and on which a power element is mounted, the multi-layered substrate comprising therein a heat sink which absorbs the heat generated by the power element and radiates the heat to the periphery thereof, wherein the heat sink is composed of a first part disposed in a first insulating layer close to the power element and a second part disposed in a second insulating layer which is under the first insulating layer, the heat sink being structured so as to extend in the lateral direction in the multi-layered substrate.

2. A multi-layered substrate according to claim 1, wherein the heat sink is formed larger in the lateral direction than in the direction of thickness of the multi-layered substrate.

3. A multi-layered substrate according to claim 1, wherein the second part of the heat sink is wider than the first part of the heat sink.

4. A multi-layered substrate according to claim 3, wherein the first and second parts of the heat sink are arranged by being stacked in a pyramidal shape.

5. A multi-layered substrate according to claim 1, wherein the first and second parts of the heat sink are connected together to form a tiered structure extending in a direction away from a region where a control circuit is provided.

6. A multi-layered substrate according claim 4, wherein the heat sink is used as a wiring for the power element.

7. A multi-layered substrate according claim 5, wherein the heat sink is used as a wiring for the power element.

8. A multi-layered substrate according to claim 1, wherein the heat sink has a main heat sink portion which is disposed beneath the power element and a sub-heat sink portion which is disposed at a position separated away from the main heat sink portion in the vicinity of the power element.

9. A multi-layered substrate according to claim 8, wherein the sub-heat sink portion is structured reaching through to the back surface of the multi-layered substrate.

10. A multi-layered substrate according to claim 9, wherein the heat sink further comprises a back-surface heat sink portion that extends in the lowermost insulating layer being the back surface.

11. A multi-layered substrate according to claim 9, wherein the sub-heat sink is not disposed in the uppermost insulating layer of the multi-layered substrate.

12. A multi-layered substrate comprising:
a substrate member made up of a plurality of insulating layers, said substrate member having a first region for mounting thereon a power element and a second region for mounting an element of a control circuit; and
a heat sink structure arranged in said substrate member so as to absorb and radiate the heat generated by said power element and guide the heat laterally from said first region to a portion other than said second region.

13. A multi-layered substrate according to claim 12, wherein said heat sink structure has a first part disposed in a first insulating layer close to said power element and a second part disposed in a second insulating layer which is under said first insulating layer.

14. A multi-layered substrate according to claim 13, wherein said second part of said heat sink structure is wider than said first part of said heat sink structure.

15. A multi-layered substrate according to claim 14, wherein said first and second parts of said heat sink structure are arranged by being stacked in a pyramidal shape.

16. A multi-layered substrate according to claim 15, wherein said heat sink structure comprises a third part extending from said second part in a direction away from said second region.

17. A multi-layered substrate according to claim 13, wherein said first and second parts of said heat sink structure are connected together to form a tiered structure extending in a direction away from said second region.

18. A multi-layered substrate according to claim 14, wherein said second part of said heat sink structure appears on a surface opposite to a surface where said power element is mounted.

19. A multi-layered substrate according claim 16, wherein said heat sink structure forms an internal wiring for said power element.

20. A multi-layered substrate according claim 17, wherein said heat sink structure forms an internal wiring for said power element.

21. A multi-layered substrate according to claim 12, wherein said heat sink structure has a main part disposed beneath said power element and an auxiliary part vertically arranged in proximity to said main part.

22. A multi-layered substrate according to claim 21, wherein said auxiliary part is structured reaching through to a back surface opposite to a surface where said power element is mounted.

23. A multi-layered substrate according to claim 22, wherein said heat sink structure further comprises a back-surface part that extends in the lowermost insulating layer being said back surface.

24. A multi-layered substrate according to claim 21, wherein said auxiliary part is not disposed in the uppermost insulating layer of said substrate member.

25. A multi-layered substrate according to claim 21, wherein said auxiliary part is disposed between said first and second regions.

26. A circuit product comprising the multi-layered substrate according to any one of claims 1 through 25, and the power element mounted on said multi-layered substrate.

* * * * *